United States Patent
Goddard et al.

(10) Patent No.: US 7,215,940 B2
(45) Date of Patent: May 8, 2007

(54) INTEGRATED CIRCUIT

(75) Inventors: Simon Peter Goddard, Sheffield (GB); Colin Charles Faulkner, Lincoln (GB)

(73) Assignee: Jennic Limited, Sheffield (GB)

(*) Notice: Subject to any disclaimer, the term of this patent is extended or adjusted under 35 U.S.C. 154(b) by 338 days.

(21) Appl. No.: 10/377,125

(22) Filed: Feb. 28, 2003

(65) Prior Publication Data
US 2004/0043741 A1    Mar. 4, 2004

(30) Foreign Application Priority Data
Feb. 28, 2002    (GB)    .................................... 0204708

(51) Int. Cl.
*H04B 1/16*    (2006.01)
(52) U.S. Cl. .................... 455/326; 455/333; 327/210
(58) Field of Classification Search ............... 455/326, 455/333, 323, 325; 327/355, 210
See application file for complete search history.

(56) References Cited

U.S. PATENT DOCUMENTS

| | | | | |
|---|---|---|---|---|
| 4,814,649 A | * | 3/1989 | Young | ........................ 327/113 |
| 5,448,772 A | | 9/1995 | Grandfield | |
| 5,767,726 A | * | 6/1998 | Wang | ........................ 327/356 |
| 5,826,183 A | * | 10/1998 | Apel | ........................ 455/326 |
| 6,073,002 A | | 6/2000 | Peterson | |
| 6,278,872 B1 | * | 8/2001 | Poulin et al. | ................ 455/333 |
| 6,603,964 B1 | * | 8/2003 | Rowley et al. | ............. 455/333 |
| 6,807,407 B2 | * | 10/2004 | Ji | ............................... 455/326 |
| 6,892,062 B2 | * | 5/2005 | Lee et al. | ................... 455/326 |

* cited by examiner

*Primary Examiner*—Edward Urban
*Assistant Examiner*—Adeel Haroon
(74) *Attorney, Agent, or Firm*—Wilmer Cutler Pickering Hale and Dorr LLP

(57) ABSTRACT

Embodiments of the present invention relates to an integrated mixer. A problem with producing low power consumption mixers is that they require a relatively high operating voltage due to the number of layers of transistor between the power rails. Accordingly, an embodiment of the present invention provides a mixer comprising first and second double balanced mixers having first and second anti-phase differential RF and LO input signals; the first double balanced mixer having a first set of four active devices each arranged to mix selected pairs of the input signals and to combine the mixed signals via first and second output nodes to produce a first portion of differential intermediate frequency output signals; the second double balanced mixer having a second set of four active devices each arranged to mix selected pairs of the input signals and to combine the mixed signals via the first and second output nodes to produce a second portion of the differential intermediate frequency output signals; the first and second portions of the output signals being combined at the first and second output nodes to produce the differential output signals.

46 Claims, 2 Drawing Sheets

INTEGRATED CIRCUIT

FIELD OF THE INVENTION

The application claims foreign priority of United Kingdom application number GB 0204708.2. The present invention relates to an integrated circuit and, more particularly, to a mixer.

BACKGROUND TO THE INVENTION

The proliferation of mobile wireless devices in recent years has lead to an interest in reducing the power consumption of the circuits used within both the mobile phone and wireless devices generally. In particular, the realisation of a CMOS RF down-converter would allow an increase in transceiver integration to be achieved. Typically, a limitation of the performance of a mobile wireless device is the period for which the battery can reliably supply power to the device between re-charges or battery replacements. Suitably, the design of mixers that have a low power consumption would increase the working period of the mobile wireless device. Alternatively, by producing circuits that consume less power, the capacity, and consequently the size, of the battery can be either reduced for a given operational life-time, which also leads to a weight reduction, or maintained for an increased operational life-time for the same weight.

It is well understood within the art that the design of mixers requires a compromise to be reached between, for example, conversion gain, local oscillator power, linearity, noise figures, port-to-port isolation, voltage supply and current consumption. A double balanced Gilbert mixer, as is well known within the art, is typically used to meet the varied requirements imposed upon an RF mixer for mobile, that is, battery powered, devices.

However, a typical Gilbert cell with differential inputs comprises a stack of at least three levels of transistors between $V_{dd}$ and ground. Due to the stacked transistors commonly found within a Gilbert cell, these cells usually require more than at least one volt to operate correctly and they have a low gain.

It is an object of the embodiments of the present invention at least to mitigate some of the problems of the prior art.

An object of embodiments of the present invention provides a mixer that is capable of being operated via a single battery cell having a nominal voltage of 1.2 volts. A further object of embodiments of the present invention provides a mixer that has very low power consumption for use in, for example, direct conversion radio receivers.

A still further object of embodiments of the present invention is to provide a mixer that has a relatively high gain and that can be fully integrated onto a silicon chip.

Another object of embodiments of the present invention is to provide a mixer having an acceptable degree of port-to-port isolation, that is, to have an acceptable degree of RF and local oscillator isolation.

SUMMARY OF THE INVENTION

Accordingly, a first aspect of embodiments of the present invention provides a mixer comprising first and second double balanced mixers having first and second anti-phase differential RF and LO input signals; the first double balanced mixer having a first set of four active devices each arranged to mix selected pairs of the input signals and to combine the mixed signals via first and second output nodes to produce a first portion of differential intermediate frequency output signals; the second double balanced mixer having a second set of four active devices each arranged to mix selected pairs of the input signals and to combine the mixed signals via the first and second output nodes to produce a second portion of the differential intermediate frequency output signals; the first and second portions of the output signals being combined at the first and second output nodes to produce the differential output signals.

In preferred embodiments, the two back-to-back double balanced mixers, when using two different transistor types, are arranged so that both mixers contribute to the current of the intermediate frequency differential output signals while sharing a common D.C. bias current.

A second aspect of embodiments of the present invention provides a mixer comprising first and second balanced mixers having first and second anti-phase differential RF and LO input signals; the first balanced mixer having a first set of active devices each arranged to mix selected ones of the input signals and to combine the mixed signals via first and second output nodes to produce a first portion of differential intermediate frequency output signals; the second balanced mixer having a second set of active devices each arranged to mix selected ones of the input signals and to combine the mixed signals via the first and second output nodes to produce a second portion of the differential intermediate frequency output signals; the first and second portions of the output signals being combined at the first and second output nodes to produce the differential output signals.

Advantageously, embodiments of the present invention encompass single balanced mixers as well as double balanced mixers. It will be appreciated that the performance of the embodiments that use the single balanced mixers will be inferior to those embodiments that use the double balanced mixers.

BRIEF DESCRIPTION OF THE DRAWINGS

Embodiments of the present invention will now be described, by way of example only, with reference to the accompanying drawings in which.

DETAILED DESCRIPTION OF PREFERRED EMBODIMENTS

Figure 1:
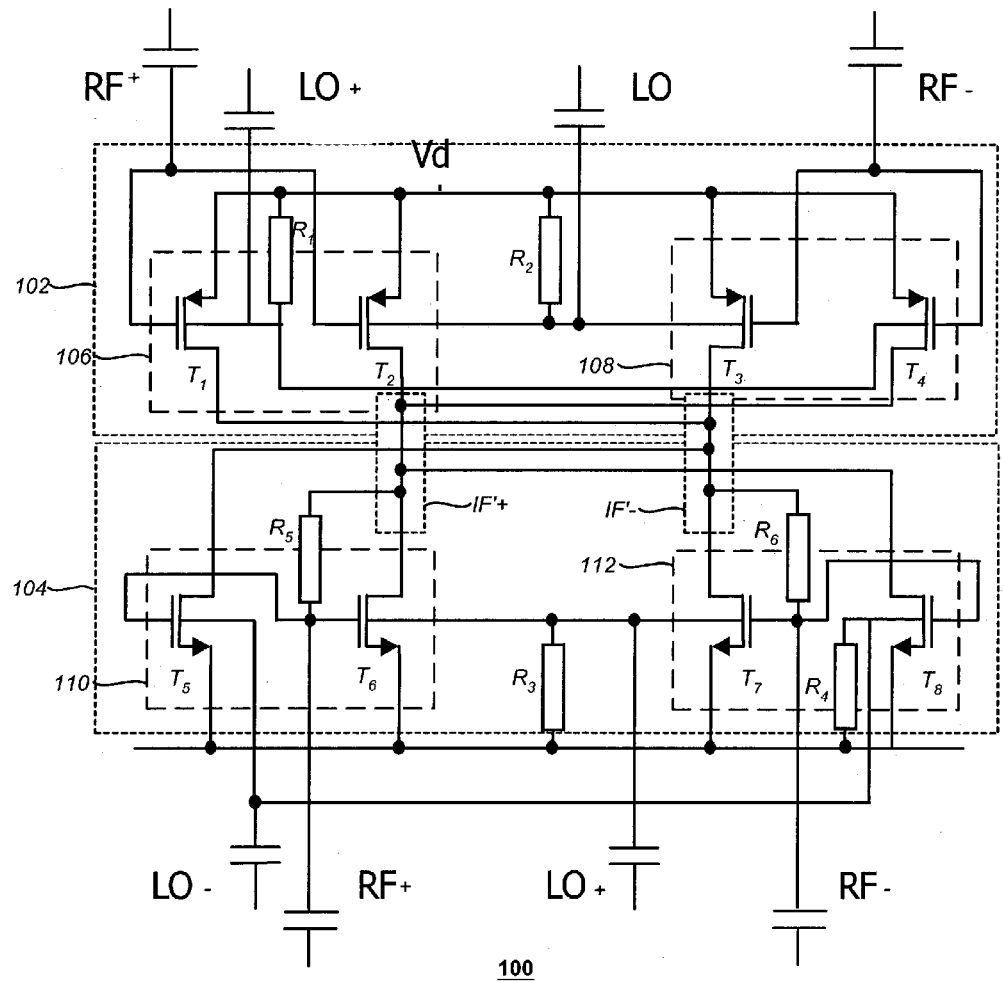
FIG. 1 illustrates a mixer according to a first embodiment of the present invention.

Referring to FIG. 1, there is shown an embodiment of an RF mixer 100 for down-converting a differential RF signal (RF+,RF−) to a differential intermediate frequency signal (IF+,IF−), or to baseband signals, using a differential local oscillator signal (LO+,LO−). The RF+ and RF− signals have a predetermined phase relationship to one another. The same applies in respect of the LO+, LO− and IF+, IF− signals. Preferably, that phase relationship is one of anti-phase. The RF mixer 100 comprises first 102 and second 104 double-balanced mixers.

The first 102 double-balanced mixer has four p-type MOSFETs $T_1$ to $T_4$. The four p-type MOSFETs $T_1$ to $T_4$ comprise a first pair 106 of p-type MOSFETs $T_1$ and $T_2$. The first pair 106 of MOSFETs $T_1$ and $T_2$ are arranged so that selected pairs or ones of the input signals RF+, RF−, LO+ and LO− are fed to the gates and wells of the MOSFETs $T_1$ and $T_2$. More particularly, the first MOSFET $T_1$ has a first phase (RF+) of the differential RF signal connected to its gate and a corresponding, or first, phase (LO+) of the differential local oscillator signal connected to its well. The second MOSFET $T_2$ has the first phase (RF+) of the RF differential input signal connected to its gate and a second, or opposite, phase (LO−) of the differential local oscillator signal connected to its well.

The four p-type MOSFETs $T_1$ to $T_4$ also comprise a second pair 108 of p-type MOSFETs $T_3$ and $T_4$. The second pair 108 of MOSFETs $T_3$ and $T_4$ are arranged so that selected pairs or ones of the input signals RF+, RF−, LO+ and LO− are fed to the gates and wells of the MOSFETs $T_3$ and $T_4$. More particularly, the third MOSFET $T_3$ has a second phase (RF−) of the differential RF signal connected to its gate and a corresponding, or second, phase (LO−) of the differential local oscillator signal connected to its well. The fourth MOSFET $T_4$ has the second phase (RF−) of the RF differential input signal connected to its gate and the first, or opposite, phase (LO+) of the differential local oscillator signal connected to its well.

The drains of the first and third MOSFETs $T_1$ and $T_3$ are coupled together to form a first intermediate frequency output node (IF'−). This combination of mixed phases of the differential RF and LO signals results in extremely good RF and LO signal isolation, that is, the input port to output port isolation is extremely good.

The drains of the second and fourth MOSFETs $T_2$ and $T_4$ are coupled together to form a second intermediate frequency output node (IF'+). Again, this combination of mixed phases of the differential RF and LO signals results in extremely good RF and LO signal isolation, that is, the input port to output port isolation is extremely good.

The second double-balanced mixer 104 has four n-type MOSFETs $T_5$ to $T_8$. The four n-type MOSFETs $T_5$ to $T_8$ comprise a first pair 110 of n-type MOSFETs $T_5$ and $T_6$. The first pair 110 of MOSFETs $T_5$ and $T_6$ are arranged so that selected pairs or ones of the input signals RF+, RF−, LO+ and LO− are fed to the gates and wells of the MOSFETs $T_5$ and $T_5$. More particularly, the fifth MOSFET $T_5$ has a first phase (RF+) of the differential RF signal connected to its gate and a second, or opposite, phase (LO−) of the differential local oscillator signal connected to its well. The sixth MOSFET $T_6$ has the first phase (RF+) of the RF differential input signal connected to its gate and a first, or corresponding, phase (LO+) of the differential local oscillator signal connected to its well.

The four n-type MOSFETs $T_5$ to $T_8$ also comprise a second pair 112 of n-type MOSFETs $T_7$ and $T_8$. The second pair 112 of MOSFETs $T_7$ and $T_8$ are arranged so that selected pairs of the input signals RF+, RF−, LO+ and LO− are fed to the gates and wells of the MOSFETs $T_7$ and $T_8$. More particularly, the seventh MOSFET $T_7$ has a second phase (RF−) of the differential RF signal connected to its gate and the first, or opposite, phase (LO+) of the differential local oscillator signal connected to its well. The eighth MOSFET $T_8$ has the second phase (RF−) of the RF differential input signal connected to its gate and the second, or corresponding, phase (LO−) of the differential local oscillator signal connected to its well.

The drains of the fifth and seventh MOSFETs $T_5$ and $T_7$ are coupled together at the first intermediate frequency output node (IF'−). This combination of mixed phases of the differential RF and LO signals results in extremely good RF and LO signal isolation, that is, the input port to output port isolation is extremely good.

The drains of the sixth and eighth MOSFETs $T_6$ and $T_8$ are coupled together at the second intermediate frequency output node (IF'+). Again, this combination of mixed phases of the differential RF and LO signals results in extremely good RF and LO signal isolation, that is, the input port to output port isolation is extremely good.

It can be appreciated that the local oscillator and RF common mode rejection stems from the cross-coupled nature of the signals produced at the first and second intermediate frequency output nodes IF'− and IF'+ respectively. The cross-coupling is arranged to sum the input signals, both LO± and RF± as appropriate, in anti-phase to achieve cancellation of these signals at the output nodes.

Furthermore, it will be appreciated that the local oscillator signal will have a noise component. This noise component is also rejected using the same principle as the rejection of the LO signal itself. This advantage unfortunately does not apply in the case of the second embodiment described below.

For preferred embodiments, the isolation is of the order of 20 dB for the RF and substantially complete rejection of the LO is achieved, subject to perfectly matched conditions, or at least a rejection of the order of 30 dB can be realised for the LO signal.

It will be appreciated that this results in good port-to-port isolation, that is, the RF and local oscillator differential, or antiphase signals, do not appear highly attenuated in the IF+ and IF− output signals.

The wells of the MOSFETs $T_1$ and $T_4$ and MOSFETs $T_2$ and $T_3$ are biased using respective resistors $R_1$ and $R_2$. The resistors $R_1$ and $R_2$ are selected so that the dc bias of the p-n junctions formed by the wells and the substrates of transistors $T_1$ to $T_4$ are appropriately biased. The wells can be biased via resistor connections $R_1$ and $R_2$ to $V_{dd}$. The wells of MOSFETs $T_5$ to $T_8$ are biased via the resistor connections $R_3$ and $R_4$ to ground.

The values of the biasing resistors $R_1$ to $R_4$ are set in conjunction with the values of the input capacitors for the LO and RF signals, in preferred embodiments, such that the high pass filter formed by the resistor $R_1$ to $R_4$ and capacitor combinations has a −3 dB cut-off frequency that is of the order of one tenth of the LO frequency. The gates of the four MOSFETs $T_5$ to $T_8$ are biased using corresponding resistors $R_5$ and $R_6$. In preferred embodiments, the resistors $R_5$ and $R_6$ have a value of at least 100 kΩ. The noise contribution to the output signals made by these two resistors reduces with increasing resistance.

The biasing resistors $R_1$ to $R_4$ produce common mode noise at the IF'+ and IF'− output nodes, which is cancelled when the output is taken differentially.

The MOSFETs $T_1$ to $T_8$ are biased in a weak inversion mode such that $V_{gs}-V_t$ is substantially 0.1V and are operated in the saturation region in preferred embodiments. It will be appreciated that such biasing results in a relatively large voltage swing being available for a 1V power source. In preferred embodiments, that voltage swing may be as large as 0.8V and is determined by the power supply voltage and the $V_{gs}-V_t$ of the transistors.

The output impedance of the MOSFETs $T_1$ to $T_8$ is relatively high, which results in a relatively high gain for the mixer.

An advantage of the embodiments of the present invention, which follows, at least in part, from the relatively high gain, is that the input signals are relatively small and the input compression is minimised or at least negligible.

It will be appreciated from the above that the first double balanced mixer 102, the output nodes IF+ and IF− and the second double balanced mixer 104 are arranged in series between the power lines. This arrangement has the significant advantage that the power voltages needed to drive the circuit can be reduced since there are only two levels of transistor between the power lines and that current re-use occurs, that is, both the first and second double balanced mixers contribute current to the output signals IF+ and IF− while sharing D.C. biasing currents.

Table 1 below illustrates performance data for an embodiment of the present invention for a simulated mixer having a 0.9V supply and a current of 200 μA.

TABLE 1

| Parameter | Value | Units |
|---|---|---|
| RF Frequency | 900 | MHz |
| LO Frequency | 899 | MHz |
| IF Frequency | 1 | MHz |
| Voltage gain | 23 | DB |
| 1 dB compression pt. | −19 | DBm |
| RF rejection | >20 | DB |

The IF frequency was chosen for simulation convenience. It will be appreciated that other IF frequencies could have equally well been chosen. It has been found that the gain compression is dominated by the mixer output stages due to the low supply voltage. Preferred embodiments may use an AGC function to lower the mixer output load under large receive signal conditions. For example, if the mixer gain of an embodiment is reduced to unity, the 1 dB compression point becomes approximately −1 dBm. Such an AGC function may be realised using a load resistor and a transistor switch.

Although the above embodiments have been described with reference to RF and LO connections to the gate and wells respectively, embodiments of the present invention are not limited to such an arrangement. Embodiments can be realised in which two gates are provided for each of the MOSFETs $T_1$ to $T_8$. These two gates would receive corresponding RF and LO signals.

Figure 2:
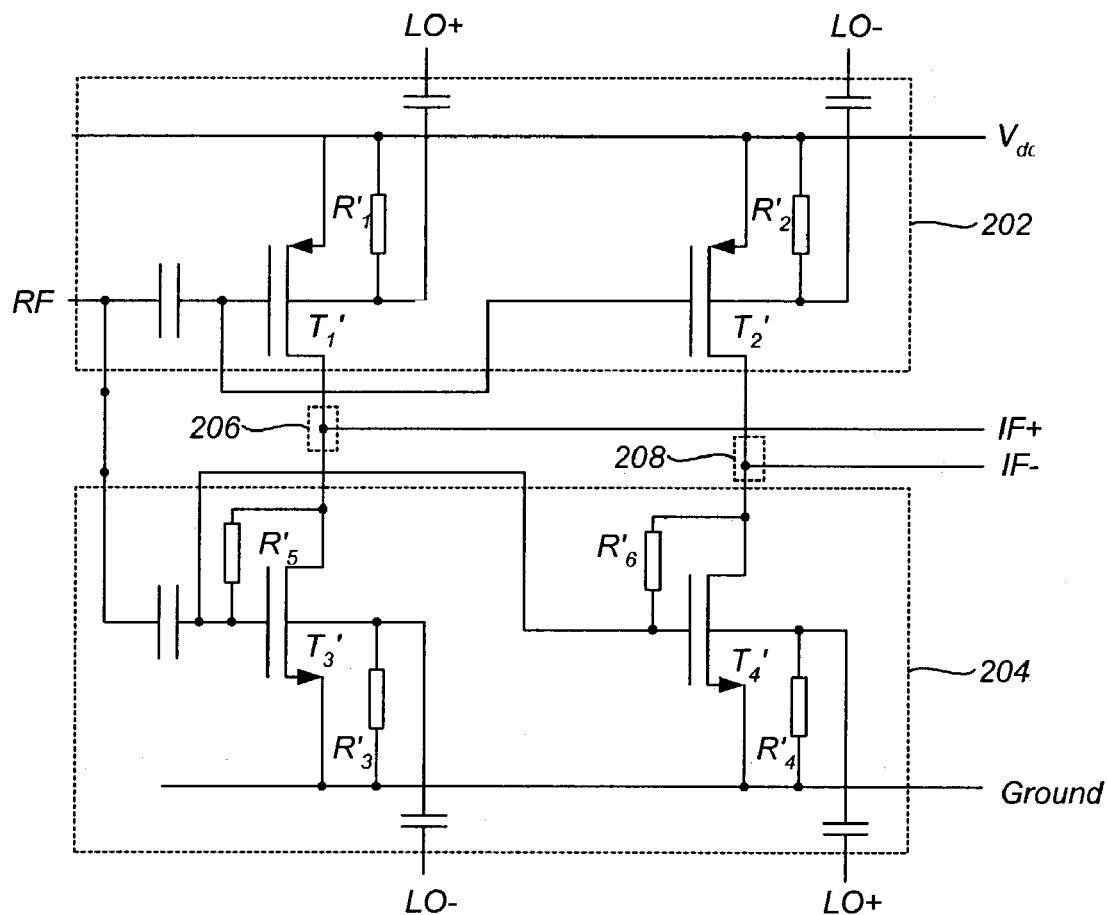
FIG. 2 depicts a mixer according to a second embodiment of the present invention.

FIG. 2 shows a mixer 200 according to a second embodiment of the present invention. The resistors $R'_1$ to $R'_6$ perform substantially the same function as corresponding resistors $R_1$ to $R_6$ described above with reference to FIG. 1. The same applies in relation to the capacitors and MOSFETs $T'_1$ to $T'_4$. It can be appreciated that the mixer 200 mixes a single-ended RF signal with a differential local oscillator signal LO+, LO−. The mixer 200 comprises first 202 and second 204 back-to-back single balanced mixers that are arranged to produce differential output signals IF+ and IF− at intermediate frequency output nodes 206 and 208.

It will be appreciated that the common mode rejection that prevails in the first embodiment will not be present within the second embodiment due to the lack of cross-coupling between the mixing of differential input signals of opposite phases.

Although the first embodiment has been described with reference to differential input signals, the present invention is not limited to such embodiments. Embodiments can be realised in which the input signals are single-ended input signals. For example, the RF signal may be a signal-ended signal. In such an embodiment, the RF signal could be connected to the RF+ input terminal and the RF− input terminal could be short-circuited to ground at frequencies of interest or visa versa.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings) and/or all of the steps of any method or process so disclosed, may be combined in any combination, except combinations where at least some of such features and/or steps are mutually exclusive.

Each feature disclosed in this specification (including any accompanying claims, abstract and drawings) might be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

We claim:

1. A mixer comprising power lines; first and second balanced mixers having RF and anti-phase differential LO input signals; the first balanced mixer having a first set of active devices each arranged to mix selected ones of the input signals and to combine the mixed signals via first and second output nodes to produce a first portion of differential intermediate frequency output signals; the second balanced mixer having a second set of active devices each arranged to mix selected ones of the input signals and to combine the mixed signals via the first and second output nodes to produce a second portion of the differential intermediate frequency output signals; the first and second portions of the output signals being combined at the first and second output nodes to produce the differential output signals, wherein the first balanced mixer, the combination of the first and second output nodes, and the second balanced mixer are arranged in series between the power lines.

2. A mixer as claimed in claim 1, in which at least one device of at least one of the first and second sets of active devices have a first input terminal and a second input terminal node for receiving respective signals of the selected ones of the input signals.

3. A mixer as claimed in claim 2, in which the active devices are FETs, and the first input terminal is a gate of a FET and the second input terminal is a well connection of the FET.

4. A mixer as claimed in claim 2, further comprising at least one biasing resistor for establishing a bias voltage for the second input terminal.

5. A mixer as claimed in claim 2, further comprising at least one current mirror for biasing the first input terminal.

6. A mixer as claimed in claim 2, in which the RF input signal is an anti-phase differential RF signal, a first active device (Ti) of the first set of active devices receives a first phase of the RF signal (RF+) and a first phase of the LO signal (LO+) and feeds the mixed pair of signals to the first output node (IF'−).

7. A mixer as claimed in claim 6, in which a second active device (T2) of the first set of active devices receives a first phase of the RF signal (RF+) and a second phase of the LO input signal (LO−) and feeds the mixed pair of signals to the second output node (IF'+).

8. A mixer as claimed in claim 7, in which a third active device (T3) of the first set of active devices receives a second phase of the RF signal (RF−) and a second phase of the LO signal (LO−) and feeds the mixed pair of signals to the first output node (IF'−).

9. A mixer as claimed in claim 8, in which a fourth active device (T4) of the first set of active devices receives a first phase of the RF signal (RF−) and a second phase of the LO signal (LO−)−+) and feeds the mixed pair of signals to the second output node (IF'+).

10. A mixer as claimed in any of claims 2 or 6, in which the RF input signal is an anti-phase differential signal, a first active device (T5) of the second set of active devices receives a first phase of the RF signal (RF+) and a second phase of the LO signal (LO−) and feeds the mixed pair of signals to the first output node (IF−).

11. A mixer as claimed in claim 10, in which a second active device (T6) of the second set of active devices receives a first phase of the RF signal (RF+) and a first phase of the LO input signal (LO+) and feeds the mixed pair of signals to the second output node (IF'+).

12. A mixer as claimed in claim 11, in which a third active device (T7) of the second set of active devices receives a second phase of the RF signal (RF−) and a first phase of the LO signal (LO+) and feeds the mixed pair of signals to the first output node (IF'−).

13. A mixer as claimed in claim 12, in which a fourth active device (T8) of the second set of active devices receives a second phase of the RF signal (RF−) and a second phase of the LO signal (LO−) and feeds the mixed pair of signals to the second output node (IF+).

14. A mixer as claimed in claim 12, in which at least one active device (T6 or T7) of the second set of active devices is biased to maintain the at least one active device in the conducting condition.

15. A mixer as claimed in any of claims 2 or 6, in which the first set of active devices of the first balanced mixer are p-type devices.

16. A mixer as claimed in claim 10, in which the second set of active devices of the second balanced mixer are n-type devices.

17. A mixer as claimed in claim 11, in which the second set of active devices of the second balanced mixer are n-type devices.

18. A mixer as claimed in claim 12, in which the second set of active devices of the second balanced mixer are n-type devices.

19. A mixer as claimed in claim 13, in which the second set of active devices of the second balanced mixer are n-type devices.

20. A mixer as claimed in claim 1, in which the first balanced mixer, the first and second output nodes and the second balanced mixer are arranged in series between power supply rails for the mixer.

21. A mixer comprising power lines; first and second double balanced mixers having first and second anti-phase differential RF and LO input signals; the first double balanced mixer having a first set of four active devices each arranged to mix selected pairs of the input signals and to combine the mixed signals via first and second output nodes to produce a first portion of differential intermediate frequency output signals; the second double balanced mixer having a second set of four active devices each arranged to mix selected pairs of the input signals and to combine the mixed signals via the first and second output nodes to produce a second portion of the differential intermediate frequency output signals; the first and second portions of the output signals being combined at the first and second output nodes to produce the differential output signals, wherein the first balanced mixer, the combination of the first and second output nodes, and the second balanced mixer are arranged in series between the power lines.

22. A mixer as claimed in claim 21, in which at least one device of at least one of the first and second sets of four active devices have a first input terminal and a second input terminal for receiving respective signals of the selected pairs of the input signals.

23. A mixer as claimed in claim 22, in which the active devices are FETs, and the first input terminal is a gate of a FET and the second input terminal is a well connection of the FET.

24. A mixer as claimed in claim 22, further comprising at least one biasing resistor for establishing a bias voltage for the second input terminal.

25. A mixer as claimed in claim 22, further comprising at least one current mirror for biasing the first input terminal.

26. A mixer as claimed in claim 24, further comprising at least one current mirror for biasing the first input terminal.

27. A mixer as claimed in claim 22, in which a first active device (Ti) of the first set of active devices receives a first phase of the RF signal (RF+) and a first phase of the LO signal (LO+) and feeds the mixed pair of signals to the first output node (IF'−).

28. A mixer as claimed in claim 27, in which a second active device (T2) of the first set of active devices receives a first phase of the RF signal (RF+) and a second phase of the LO input signal (LO−) and feeds the mixed pair of signals to the second output node (IF'+).

29. A mixer as claimed in claim 28, in which a third active device (T3) of the first set of active devices receives a second phase of the RF signal (RF−) and a second phase of the LO signal (LO−) and feeds the mixed pair of signals to the first output node (IF'−).

30. A mixer as claimed in claim 29, in which a fourth active device (T4) of the first set of active devices receives a second phase of the RF signal (RF−) and a first phase of the LO signal (LO+) and feeds the mixed pair of signals to the second output node (IF'+).

31. A mixer as claimed in claim 22, in which a first active device (T5) of the second set of active devices receives a first phase of the RF signal (RF+) and a second phase of the LO signal (LO−) and feeds the mixed pair of signals to the first output node (IF'−).

32. A mixer as claimed in claim 31, in which a second active device (T6) of the second set of active devices receives a first phase of the RF signal (RF+) and a first phase of the LO input signal (LO−) and feeds the mixed pair of signals to the second output node (IF'+).

33. A mixer as claimed in claim 32, in which a third active device (T7) of the second set of active devices receives a second phase of the RF signal (RF−) and a first phase of the LO signal (LO+) and feeds the mixed pair of signals to the first output node (IF'−).

34. A mixer as claimed in claim 33, in which a fourth active device (T8) of the second set of active devices receives a second phase of the RF signal (RF−) and a first phase of the LO signal (LO+) and feeds the mixed pair of signals to the second output node (IF'+).

35. A mixer as claimed in claim 33, in which at least one active device (T6 or T7) of the second set of four active devices is biased to maintain the at least one active device in the conducting condition.

36. A mixer as claimed in claim 22, in which the first set of four active devices of the first double balanced mixer are p-type devices.

37. A mixer as claimed in claim 31, in which the second set of four active devices of the second double balanced mixer are n-type devices.

38. A mixer as claimed in claim 32, in which the second set of four active devices of the second double balanced mixer are n-type devices.

39. A mixer as claimed in claim 33, in which the second set of four active devices of the second double balanced mixer are n-type devices.

40. A mixer as claimed in claim 34, in which the second set of four active devices of the second double balanced mixer are n-type devices.

41. A mixer as claimed in claim 21, in which the first double balanced mixer, the first and second output nodes and the second double balanced mixer or the first balanced mixer, the first and second output nodes and the second balanced mixer are arranged in series between power supply rails for the mixer.

42. A mixer as claimed in claim 41, in which the voltage difference between the power rails is substantially IV.

43. A mixer as claimed in any of claims 1 or 21, in which the maximum voltage differential between the first and second output nodes is 0.8V.

44. A mixer as clamed in any of claims 21, 22, 23 or 41, in which the first and second sets of active devices each comprise four or two active devices.

45. A mixer as claimed in any of claims 1 or 21, in which the active devices have two gates for receiving corresponding selected ones of the input signals.

46. A mixer as claimed in any of claims 1 or 21, in which the active devices have respective gate and well connections for receiving corresponding ones of the input signals.

* * * * *